Figure 1:
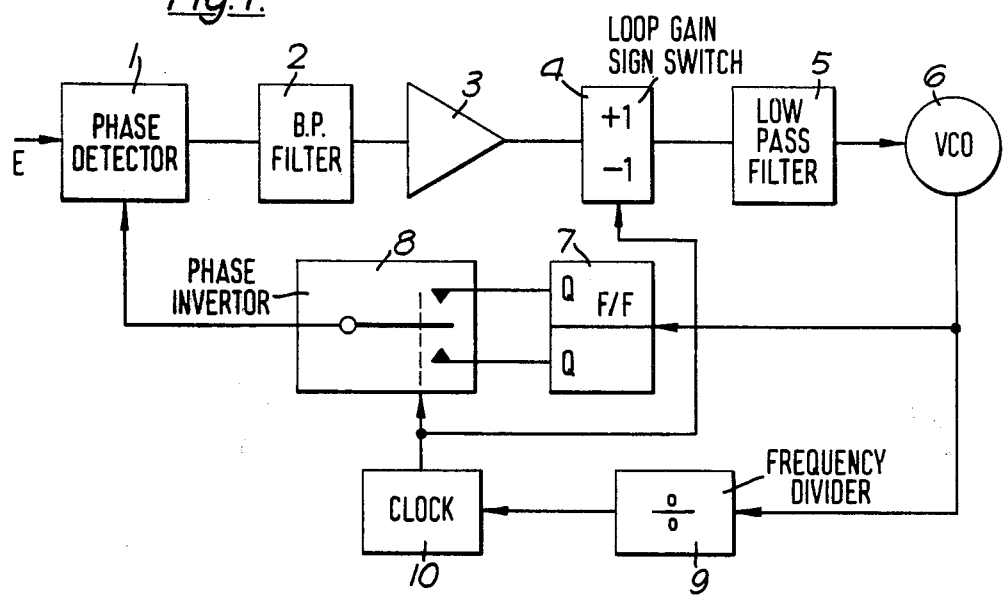

United States Patent [19]
Lalande et al.

[11] 4,115,743
[45] Sep. 19, 1978

[54] ERROR COMPENSATING PHASE-LOCKED LOOP

[75] Inventors: Jacques Alfred Lalande, Velizy-Villacoublay; Rene Roger Thevin, Bures sur Yvette, both of France

[73] Assignee: International Standard Electric Corporation, New York, N.Y.

[21] Appl. No.: 821,388

[22] Filed: Aug. 3, 1977

[51] Int. Cl.² ............................................... H03B 3/04
[52] U.S. Cl. ........................................ 331/14; 331/17
[58] Field of Search .................. 331/14, 17, 16, 18, 331/25; 328/155; 307/262

[56] References Cited
U.S. PATENT DOCUMENTS

| | | | |
|---|---|---|---|
| 3,308,393 | 3/1967 | Lind | 331/14 |
| 3,781,705 | 12/1973 | Dishal et al. | 331/17 |
| 3,973,212 | 8/1976 | Walloch | 331/14 |
| 3,991,378 | 11/1976 | Schaefer | 331/14 |

*Primary Examiner*—John Kominski
*Attorney, Agent, or Firm*—James B. Raden; Marvin M. Chaban

[57] ABSTRACT

A phase-locked loop which simultaneously switches both the phase of the reference signal received from the voltage-controlled oscillator of the loop and the sign of the d.c. channel gain. The switching is performed at a frequency lying between the phase of the incident wave and the loop cut-off frequency.

5 Claims, 2 Drawing Figures

ERROR COMPENSATING PHASE-LOCKED LOOP

This invention concerns improvements in phase-locked loops to prevent certain errors introduced by components in a conventional loop.

There are numerous examples of the use of phase-locked loops. In Doppler systems, the phase of the signal contains information and the phase-locked loop is then used to reproduce a signal free of noise and containing this information. It is clear that in such a case, the phase-locked loop must be highly accurate; that is to say, it should follow the phase of the incident wave exactly. However, conventional phase loops manifest troublesome limitations and often produce errors in phase tracking. These errors are produced by some of the components in the loop. A phase-locked loop usually includes a phase detector which receives the incident wave and a reference signal, an amplifier to amplify the error signal supplied by the detector, a low-pass filter whose d-c output signal controls an oscillator which furnishes the said reference signal. Now, some of these components introduce errors which are due in particular to the fact that the gain of the loop is not infinite, or to the false zero of the d-c part of the loop, as for example at the phase detector output or the amplifier input, and to the nonlinearity of the phase detector. In fact, it is observed that the phase detector introduces a noticeable error, whether it be of the "double balanced mixer" type or a transistorized demodulator. Unbalance of the diodes in the first type or of the transistors in the second is a source of error which can vary as a function of the level of the incident signal. Methods are known to compensate such errors. One method, for example, is to measure the error signal at the phase detector output when the reference signal is applied to both of its inputs and to adjust the loop output signal as a function of this measured error signal. The major problem with this method of compensation is that it requires a large number of extra circuits, hence increasing the size and cost of the phase-locked loop.

So, one object of this invention is a phase-locked loop which does not present the above-mentioned problems.

Another object of the invention is a phase-locked loop providing automatic compensation of errors without requiring a large number of extra circuits.

According to one characteristic of the invention, the phase-locked loop contains means to switch simultaneously, and at a frequency lying between the frequency of the incident wave and the cut-off frequency of the loop, on the one hand the phase of the reference signal furnished by the voltage-controlled oscillator and on the other hand the sign of the d-c channel gain.

The effect of this switching is to render the phase information periodic, thus permitting balanced circuit operation and elimination by the loop filter of the error due to the false zero.

Figure 2:
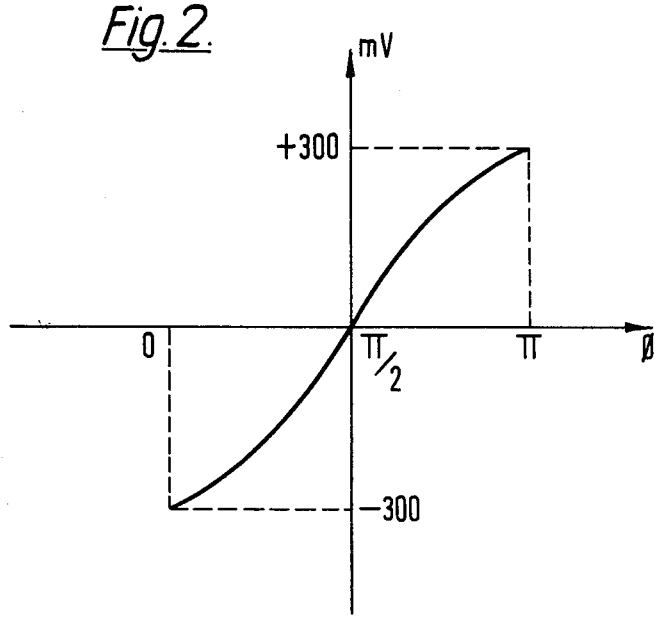

Other objects, characteristics and advantages of this invention will be brought out more clearly in the following description of a particular embodiment, the said description being given for illustration and in connection with the attached drawings in which:

FIG. 1 shows a block diagram of a phase-locked loop according to the invention; and FIG. 2 shows the theoretical characteristic curve of the phase detector used in the loop of FIG. 1.

FIG. 1 shows a block diagram of a phase-locked loop in accordance with the principles of the invention. Thus one finds a phase detector 1 which receives an incident wave at input E and a reference signal and which supplies an error signal to the d-c channel including a band-pass filter 2, an amplifier 3, a loop gain sign switch 4, a low-pass filter 5, and a voltage-controlled oscillator 6. The output signal from oscillator 6 is applied on the one hand to a flip-flop 7 and on the other hand to a frequency divider circuit 9. The divider circuit 9 controls a clock 10 whose output is applied to the sign switch 4 and to a phase inverter 8 which is connected to both outputs of the flip-flop 7. The output of phase inverter 8 constitutes the reference signal to be applied to phase detector 1. As mentioned above, one important characteristic of the invention consists of the simultaneous switching of the phase of the reference signal and of the loop gain sign. The switching frequency lies between the frequency of the incident wave and the cut-off frequency of the loop, and it is given by clock 10 based on the frequency obtained by division of the frequency of the oscillator 6 output signal. The phase of the reference signal is switched by inverter 8 which applies alternately the output Q or Q of flip-flop 7 to the input of detector 1. Flip-flop 7 actually constitutes a 2:1 frequency divider, so the output frequency of oscillator 6 must be twice the frequency of the incident wave. The phase detector 1 therefore receives a reference signal whose phase (0 or $\pi$) is inverted at the rate of the switching frequency, and it therefore furnishes an error signal which is no longer continuous.

FIG. 2 shows the theoretical characteristic curve of a phase detector of the "double balanced mixer" type. When the phase difference $\phi$ between the signals present at the input varies from 0 to $\pi$, the d-c voltage at the detector output varies from $-300$ mV to $+300$ mV. The output voltage is a sine function of the phase difference, but the detector is in fact used in the linear part of the curve of FIG. 2. For a zero error signal, the phase difference is $\pi/2$.

Switching of the phase of the reference signal applied to phase detector 1 causes the detector output signal to alternate. This output signal is filtered by the low-pass filter 2, which centered to the switching frequency, eliminates especially the high frequency components introduced at input E of detector 1. Amplifier 3 and sign switch 4 convert the error signal again into a d-c signal. However, since the phase detector 1 is not perfect, there often exists an unbalance between the diodes or transistors depending upon the type of detector used. This unbalance causes the superposition of a d-c signal on the error signal. This d-c signal is switched by sign switch 4 making it appear like an a-c signal at the input of filter 5. The same is true for the false zero voltage at the input to amplifier 3; it is switched by sign switch 4 and therefore appears like an a-c signal. Filter 5 is a low-pass filter which eliminates all a-c components and allows only d-c components to pass. Thus, the useful signal of the loop is applied without attenuation to oscillator 6, while errors introduced by detector 1 and amplifier 3 are eliminated. Thus, errors introduced into the d-c part of the loop by the components are eliminated by the phase-locked loop according to the invention. Elimination of the error due to the detector and that due to the amplifier permits a weaker signal level at the loop input and a wider noise bandwidth. A phase detector with wider tolerances can also be used without reducing the measuring accuracy.

The phase-locked loop in accordance with the principles of the invention presents no special problem for anyone skilled in the art. The output from oscillator 6 is a noise-free signal containing the phase information of the signal applied to input E of the loop.

Although this invention has been described in connection with a particular embodiment, it is clearly not limited by the said description given as an illustration and is capable of modifications or variants still lying within its scope.

We claim:

1. A phase-locked loop adapted to provide an output signal of the same phase as the input signal, including: a phase detector for receiving the input signal and means for feeding to said detector a reference signal furnishing an error voltage proportional to the phase difference between these output and input signals, a band-pass filter coupled to receive an output signal from said phase detector to eliminate the high frequency components of the phase detector output signal, a high-gain amplifier coupled to receive the signal with eliminated components whose gain sign is switched by a clock signal, a low-pass filter receptive of amplified signals to eliminate the a-c components of the output signal of the said amplifier, a voltage-controlled oscillator controlled by the output signal from the said low-pass filter, and a phase switch supplying, from the output signal of the said oscillator, the said reference signal of the same frequency as the said input signal and whose phase is inverted on command of the said clock signal.

2. A phase-locked loop according to claim 1, wherein the said clock signal has a frequency between the frequency of the said input signal and the cut-off frequency of the loop.

3. A phase-locked loop according to claim 1, wherein the said band-pass filter is centered to the frequency of the said clock signal.

4. A phase-locked loop according to claim 1, wherein the said clock signal is obtained by division of the frequency of the output signal of the said oscillator.

5. A phase-locked loop according to claim 1, wherein the said phase switch contains a flip-flop whose clock input receives the output signal of the said oscillator and an inverter connecting to the said phase detector responsive to a command of the said clock signal, to transmit either the direct output or the inverted output of the said flip-flop.

* * * * *